(12) United States Patent
Strong et al.

(10) Patent No.: US 11,751,367 B2
(45) Date of Patent: Sep. 5, 2023

(54) MICROELECTRONIC PACKAGE ELECTROSTATIC DISCHARGE (ESD) PROTECTION

(71) Applicant: Intel Corporation, Santa Clara, CA (US)

(72) Inventors: Veronica Aleman Strong, Hillsboro, OR (US); Johanna M. Swan, Scottsdale, AZ (US); Aleksandar Aleksov, Chandler, AZ (US); Adel A. Elsherbini, Tempe, AZ (US); Feras Eid, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 84 days.

(21) Appl. No.: 17/468,510

(22) Filed: Sep. 7, 2021

(65) Prior Publication Data
US 2021/0410343 A1 Dec. 30, 2021

Related U.S. Application Data

(63) Continuation of application No. 16/659,459, filed on Oct. 21, 2019, now Pat. No. 11,147,197.

(51) Int. Cl.
*H05K 9/00* (2006.01)
*H01L 23/60* (2006.01)
(Continued)

(52) U.S. Cl.
CPC ......... *H05K 9/0079* (2013.01); *C08G 61/126* (2013.01); *C08G 73/0611* (2013.01);
(Continued)

(58) Field of Classification Search
CPC ............... H05K 9/0079; C08G 61/126; C08G 73/0611; C08G 85/004; C08G 2261/1424;
(Continued)

(56) References Cited

U.S. PATENT DOCUMENTS 9,901,018 B1 2/2018 Richmond et al.
11,147,197 B2 * 10/2021 Strong ................ H01L 21/4867
(Continued)

OTHER PUBLICATIONS

Li, Lei, et al., "Nanocomposite of Polyaniline Nanorods Grown on Graphene Nanoribbons for Highly Capacitive Pseudocapacitors," ACS Applied Materials and Interfaces 2013, vol. 5.
(Continued)

Primary Examiner — Tong-Ho Kim
(74) Attorney, Agent, or Firm — Akona IP

(57) ABSTRACT

Embodiments may relate to a microelectronic package comprising: a die and a package substrate coupled to the die with a first interconnect on a first face. The package substrate comprises: a second interconnect and a third interconnect on a second face opposite to the first face; a conductive signal path between the first interconnect and the second interconnect; a conductive ground path between the second interconnect and the third interconnect; and an electrostatic discharge (ESD) protection material coupled to the conductive ground path. The ESD protection material comprises a first electrically-conductive carbon allotrope having a first functional group, a second electrically-conductive carbon allotrope having a second functional group, and an electrically-conductive polymer chemically bonded to the first functional group and the second functional group permitting an electrical signal to pass between the first and second electrically-conductive carbon allotropes.

20 Claims, 11 Drawing Sheets

(51) Int. Cl.
*H01L 21/48* (2006.01)
*C08G 61/12* (2006.01)
*C08G 73/06* (2006.01)
*C08G 85/00* (2006.01)
*H01L 23/498* (2006.01)

(52) U.S. Cl.
CPC ........ C08G 85/004 (2013.01); H01L 21/4867 (2013.01); H01L 23/60 (2013.01); *C08G 2261/1424* (2013.01); *C08G 2261/3223* (2013.01); *C08G 2261/514* (2013.01); *C08G 2261/78* (2013.01); *H01L 23/498* (2013.01)

(58) Field of Classification Search
CPC ...... C08G 2261/3223; C08G 2261/514; C08G 2261/78; C08G 73/0266; C08G 2261/364; C08G 2261/43; C08G 2261/94; H01L 21/4867; H01L 23/60; H01L 23/498; H01L 23/49877

USPC ...................................................... 257/746
See application file for complete search history.

(56) References Cited

U.S. PATENT DOCUMENTS

2010/0187652 A1  7/2010  Yang
2015/0274924 A1  10/2015 Pandey et al.
2018/0079647 A1  3/2018  Park et al.
2019/0042968 A1* 2/2019  Lampert ................ H01L 23/34

OTHER PUBLICATIONS

Saini Parveen, et al., "Enhanced electromagnetic interference shielding effectiveness of polyaniline functionalized carbon nanotubes filled polystyrene composites," Published Jan. 11, 2013, Springer Science+Business Media.

* cited by examiner

Identifying, in a substrate of a microelectronic package, a ground path that electrically couples a signal path and a ground connection
905

Positioning, in the ground path between the signal path and the ground connection, an ESD protection material
910

MICROELECTRONIC PACKAGE ELECTROSTATIC DISCHARGE (ESD) PROTECTION

BACKGROUND

This application is a continuation of U.S. application Ser. No. 16/659,459, filed Oct. 21, 2019, entitled "MICROELECTRONIC PACKAGE ELECTROSTATIC DISCHARGE (ESD) PROTECTION," incorporated herein by reference in its entirety.

One concern for microelectronic packages is electrostatic discharge (ESD). ESD may refer to a sudden onset of charge transfer (i.e., electron flow) between two objects with different electric potentials. These static voltages may cause partial to full breakdown of an integrated circuit (IC) of the microelectronic package.

DETAILED DESCRIPTION

Figure 1:
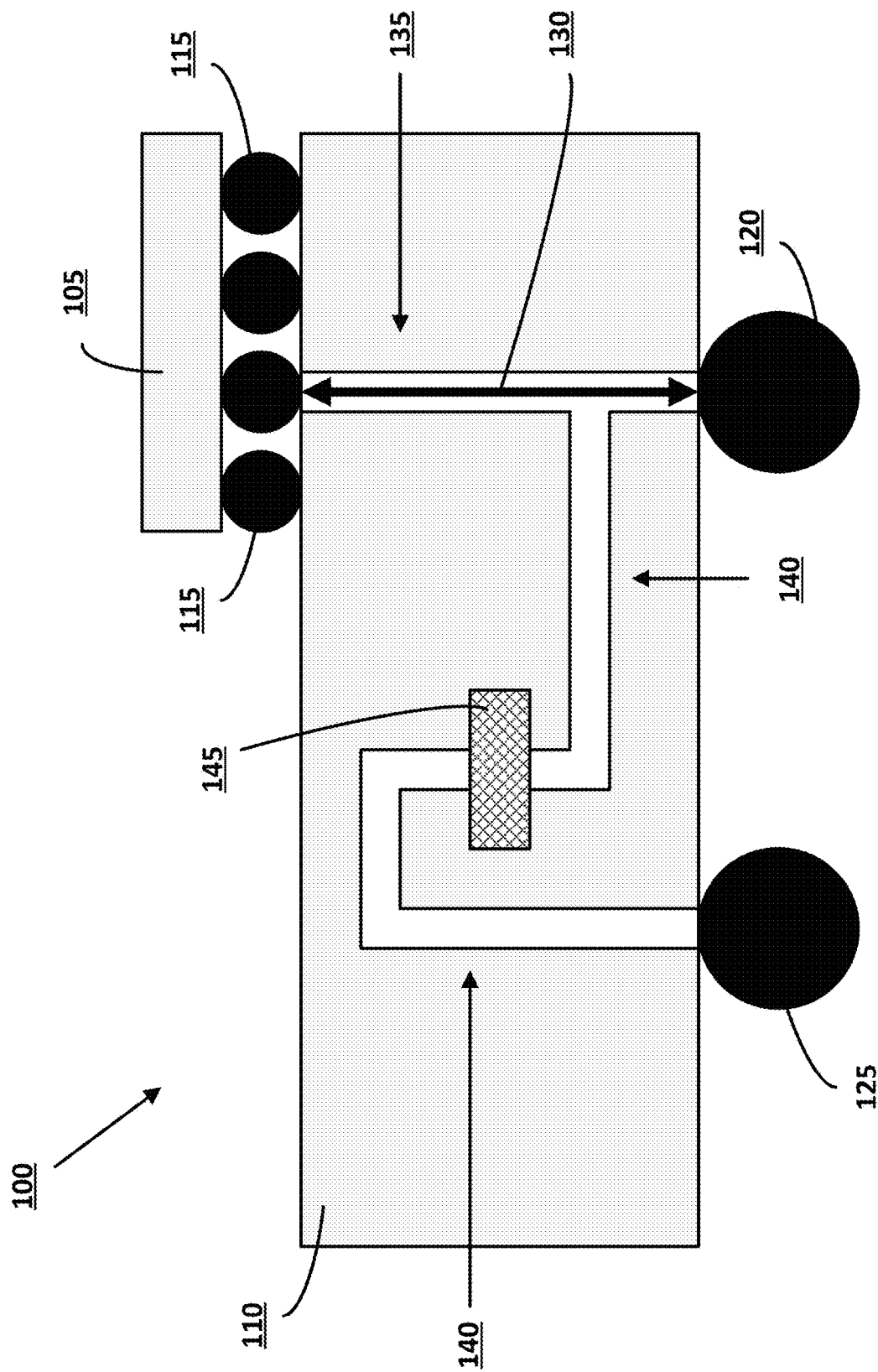
FIG. 1 depicts an example microelectronic package with an ESD protection material, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature [[formed/deposited/disposed/etc.]] on a second feature," may mean that the first feature is formed/deposited/disposed/etc. over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using optical microscopy, scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

It will be understood that the term "microelectronic package" may, in other situations, be referred to as a "semiconductor package." However, the term "microelectronic package" will be used herein for the sake of consistency.

As noted, ESD may be undesirable in a microelectronic package because it may cause partial to full breakdown of ICs of the microelectronic package, even when the ICs are only exposed to the static voltages for a relatively short period of time. Hence, ESD protection may be viewed as a reliability concern and an important element of any electronic system, especially when IC costs are considered.

Generally, innovation into ESD protection may be desired to keep up with the ongoing trend of shrinking IC sizes and the increased number of high-speed signal lines or higher operating frequencies. This trend may result in a desire for minimizing the IC area that is dedicated to ESD protection features on die (such as on-die diodes). It may therefore be desirable to offload some of the ESD protection features from the die and integrate them in the package as an embedded package solution in next-generation packaging technologies.

Embodiments herein relate to an embedded packaging solution that may incorporate composites of two-dimensional (2D) materials (i.e., 2D electrically-conductive carbon allotropes), electrically-conductive polymers, and non-conductive polymer matrix through direct chemical functionalization. Generally, as used herein and unless explicitly indicated otherwise, the term "conductive" may refer to electrically-conductive. The intrinsically-conductive polymers may be directly functionalized from either 2D materials or metal oxides to form a device with an interconnected network for improved electrically pathways when over-voltages (e.g., ESD) are applied. Additionally, intrinsically-conductive polymers may better incorporate carbon-based allotropes into non-conductive polymer media. Incorporating conductive 2D networks with large aspect ratios (e.g., graphene nanoribbons (GNR), graphene nanoplatelets (GNPs) carbon nanotubes (CNTs), carbon fibers, etc.) into a composite matrix may lower percolation threshold (i.e., the minimum amount of conductive filler needed) while still imparting an improved electrical pathway.

Embodiments herein may provide a number of advantages. For example, selective and direction functionalization via grafting—from or to—may improve electron transport in the composite when the voltage (e.g., the ESD) has reached a triggered voltage. Intrinsically-conductive polymers may be reversibly doped/dedoped to transition from a conductive state to a non-conductive state, which may allow for specific tuning of the ESD voltage range. The choice of intrinsically-conductive polymers may lower the trigger-voltage, while 2D materials such as the above-described carbon allotropes may improve conduction pathways at a lower percolation threshold.

Figure 2:
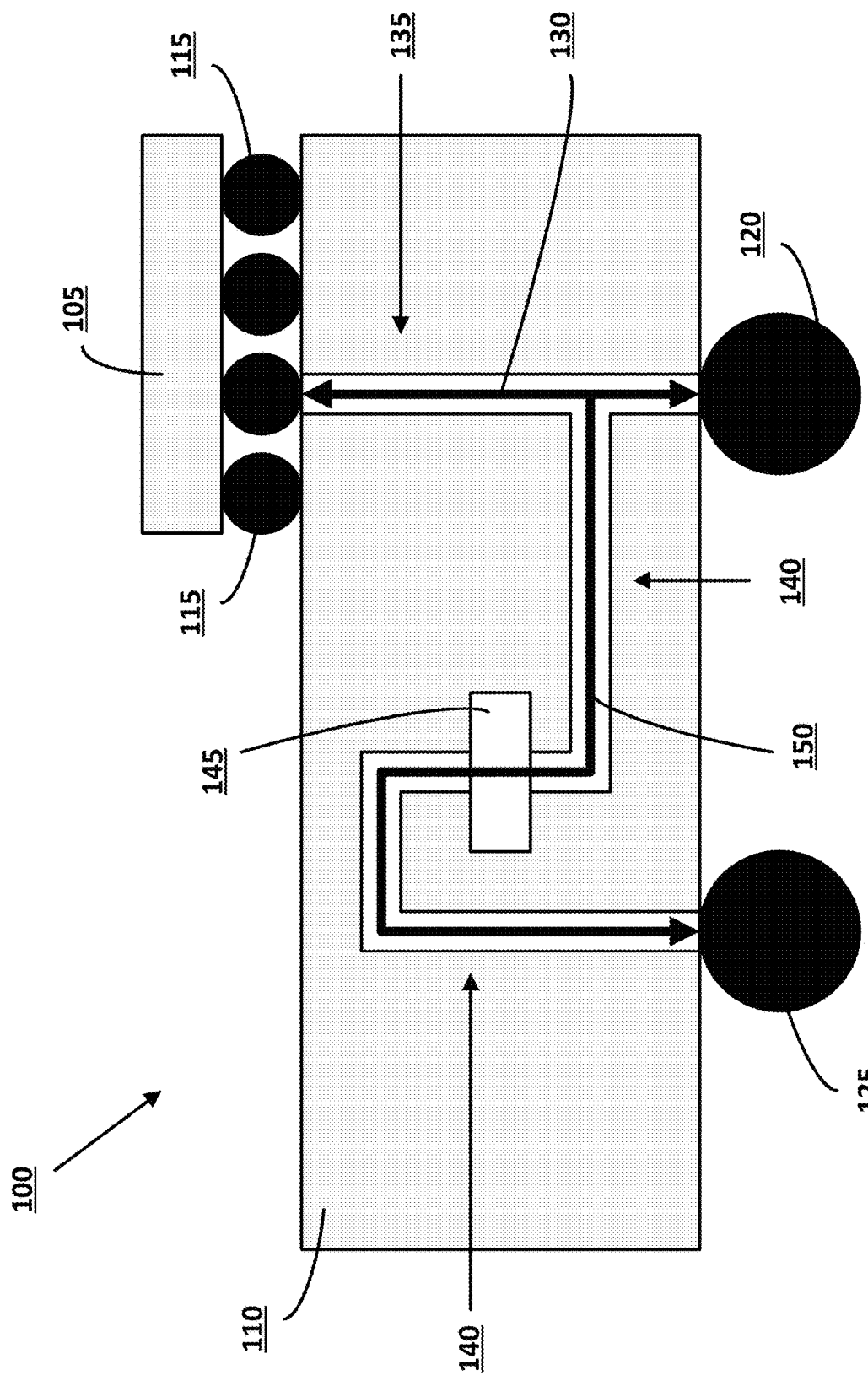
FIG. 2 depicts an alternative view of the example microelectronic package of FIG. 1, in accordance with various embodiments.

FIGS. 1 and 2 depict an example microelectronic package 100 with an ESD protection material 145, in accordance with various embodiments. Generally, the package 100 may include a die 105 coupled with a package substrate 110. The die 105 may be or include, for example, a processor such as a central processing unit (CPU), general processing unit, a core of a distributed processor, or some other type of processor. Alternatively, the die 105 may be or include a memory such as a double data rate (DDR) memory, a nonvolatile memory (NVM), a volatile memory, a read-only memory (ROM), or some other type of memory or die. In some embodiments the die 105 may be or include a radio frequency (RF) chip or RF circuitry that is configured to generate, process, transmit, or receive a wireless signal such as a third generation (3G), a fourth generation (4G), a fifth generation (5G), a Wi-Fi, or some other type of wireless signal. In some embodiments the die 105 may include one or more passive components such as capacitors, resistors, etc. The various active or passive components may be positioned within, partially within, or on the surface of the die 105.

The package substrate 110 may be, for example, considered to be a cored or coreless substrate. The package substrate 110 may include one or more layers of a dielectric material which may be organic or inorganic. The package substrate 110 may further include one or more conductive elements such as vias, pads, traces, microstrips, striplines, etc. The conductive elements may be internal to, or on the surface of, the package substrate. Generally, the conductive elements may allow for the routing of signals through the package substrate 110, or between elements that are coupled to the package substrate 110. In some embodiments the package substrate 110 may be, for example, a printed circuit board (PCB), an interposer, a motherboard, or some other type of substrate. It will be understood that although the package substrate 110 is discussed herein as an element of the microelectronic package 100, in other embodiments the package substrate 110 may be considered to be an element separate from the microelectronic package 100 to which the microelectronic package 100 is coupled.

The die 105 may be coupled with the package substrate 110 by one or more interconnects 115. The interconnects 115 may be, for example, C4 (controlled collapse chip), or flip-chip, bumps that are formed of a material such as tin, silver, copper, etc. Generally, the interconnects 115 may physically or communicatively couple the die 105 with the package substrate 110. For example, one or more of the interconnects 115 may physically couple with, and allow electrical signals to pass between, pads of the die 105 and pads of the package substrate 110 (not shown for the sake of elimination of clutter of FIG. 1). In other embodiments, one or more of the interconnects 115 may physically couple the die 105 and the package substrate 110, but the interconnects 115 may not communicatively couple the die 105 and the package substrate 110.

The microelectronic package 100 may further include a plurality of interconnects such as interconnects 120 and 125. The interconnects 120 and 125 may be formed of a material such as tin, copper, silver, etc. Specifically, the interconnects 120/125 may be elements of a ball grid array (BGA), pin grid array (PGA), land grid array (LGA), etc. The interconnects 120/125 may communicatively or physically couple the microelectronic package 100 to another element of an electronic device such as a PCB, a motherboard, an interposer, etc.

More specifically, the interconnect 120 may communicatively couple the microelectronic package 100 with a voltage input. The voltage input may be, for example, a power source, a communicative pathway (e.g., a signal line or a power line), or some other element of an electronic device of which the microelectronic package 100 is a part. Specifically, the voltage input may provide an electrical signal 130 with an input voltage $V_{in}$. The interconnect 125 may communicatively couple the microelectronic package 100 with a ground. The ground may be, for example, a ground plane of the electronic device or some other ground.

As noted above, the substrate 110 of the microelectronic package 100 may include a number of conductive elements such as vias, traces, microstrips, striplines, pads, etc. The conductive elements may form a number of signal/electronic pathways through the substrate 110. One such pathway is signal path 135. The signal path 135 may allow for the electrical signal 130 to travel between the interconnect 120 and the die 105. The electrical signal 130 may be, for example, a data signal, a power signal, or some other type of electrical signal. The substrate 110 may further include a ground path 140. The ground path 140 may communicatively couple the signal path 135 with the interconnect 125 and, through interconnect 125, to ground. In some embodiments, the ground path 140 may be referred to as a "shunt" to ground.

The ground path 140 may include an ESD protection material 145. As can be seen, the ESD protection material 145 may be located in the ground path 140 generally between the signal path 135 and the ground connection at interconnect 125. The specific makeup of the ESD protection material 145 may be discussed in greater detail below, however, at a high level the ESD protection material 145 may behave as an insulator at low voltages, and be conductive at relatively high voltages. Specifically, the ESD protection material 145 may have a voltage threshold referred to herein as $V_{trigger}$. If $V_{in}$ is below (or, in some embodiments, at or below) $V_{trigger}$, then the ESD protection material 145 may be insulative and not allow electrical signals to flow between the signal path 135 and the interconnect 125. An example of such an insulative state is shown in FIG. 1.

However, if $V_{in}$ is above (or, in some embodiments, at or above) $V_{trigger}$, then the ESD protection material may switch to a conductive state. An example of such a conductive state is shown in FIG. 2. Specifically, at least a portion of the electrical signal 130 may still traverse through the signal path 135. However, a portion 150 of the electrical signal may also be shunted to ground through the ground path 140.

In operation, $V_{trigger}$ may be set to a level that is above the level at which a data or power signal may desirably traverse along the signal path 135. However, it may also be desirable for $V_{trigger}$ to be at a level that is below a voltage level at which ICs of the die 105 may become damaged. More specifically, it may be desirable for $V_{trigger}$ to be at a level that is below the voltage level which may be present in an ESD event. As such, if ESD occurs, then $V_{in}$ may become greater than (or equal to, in some embodiments) $V_{trigger}$, and so the ESD protection material 145 may become conductive and at least a portion of the voltage from the ESD may shunt to ground through the ground path 140. However, if there is no ESD event, then $V_{in}$ may be below (or equal to, in some embodiments) $V_{trigger}$ and so electrical communication along the signal path 135 may occur as normal.

Generally, it may be desirable for $V_{trigger}$ to be less than or equal to a few volts (e.g. between approximately 2 and approximately 10 volts (V), or more specifically between approximately 4 and approximately 5 V.) However, it will be understood that these are example ranges and the $V_{trigger}$ level of other embodiments may vary. Such variation may be based on, for example, the specific use case to which the microelectronic package may be put, specific properties of the die 105, properties of the ICs of the die 105, or other material or design considerations. More specifically, $V_{trigger}$ may be based on or derived from the type of conductive polymer, the type of non-conductive polymer matrix, the type of carbon allotrope, etc. Additionally, $V_{trigger}$ may be based on or derived from the ratio of the conductive elements such as the conductive polymer and carbon allotrope to the non-conductive elements such as the non-conductive polymer matrix in the ESD protection material.

It will be understood that the above-described FIGS. 1 and 2 are intended as example, and other embodiments may vary with respect to number of elements, specific configurations, etc. For example, it will be understood that the signal path 135 and the ground path 140 are highly simplified examples, and other embodiments may include additional conductive elements such as pads, traces, etc. Similarly, the relative sizes, shapes, or number of the paths, the dies, the interconnects, etc. may be different in other embodiments. For example, some embodiments may have additional dies 105, additional interconnects 115/120/125, additional signal paths 135 or ground paths 140, additional ESD protection materials 145, etc., or one or more of those elements in a location that is different than the location depicted in FIG. 1 or 2. Other variations may be present in other embodiments.

FIGS. 4-8 provide details of the ESD protection material 145. Specifically, embodiments herein generally relate to a composite ESD protection material (e.g., ESD protection material 145) within a substrate (e.g., substrate 110). The ESD protection material may be composed of intrinsically-conductive polymers functionalized on 2D high aspect-ratio carbon allotropes within a non-conductive polymer matrix. As used herein, an "intrinsically-conductive polymer" may refer to a polymer material that is electrically conductive.

Generally, the FIGS. 4-8 are depicted using an example of a GNR as the carbon allotrope. The GNR may be chemically bonded with a complimentary thiophene moiety through click chemistry, or acid-based reactions. The now-tethered thiophene molecule may participate in polymerization by adding thiophene or terthiophene in the presence of an oxidant (for example iron chloride ($FeCl_3$) or some other oxidant). The thiophene/terthiophene and oxidant may generate polythiophene (PT) nanofibers directly grown off of edges of the GNR.

Figure 3:
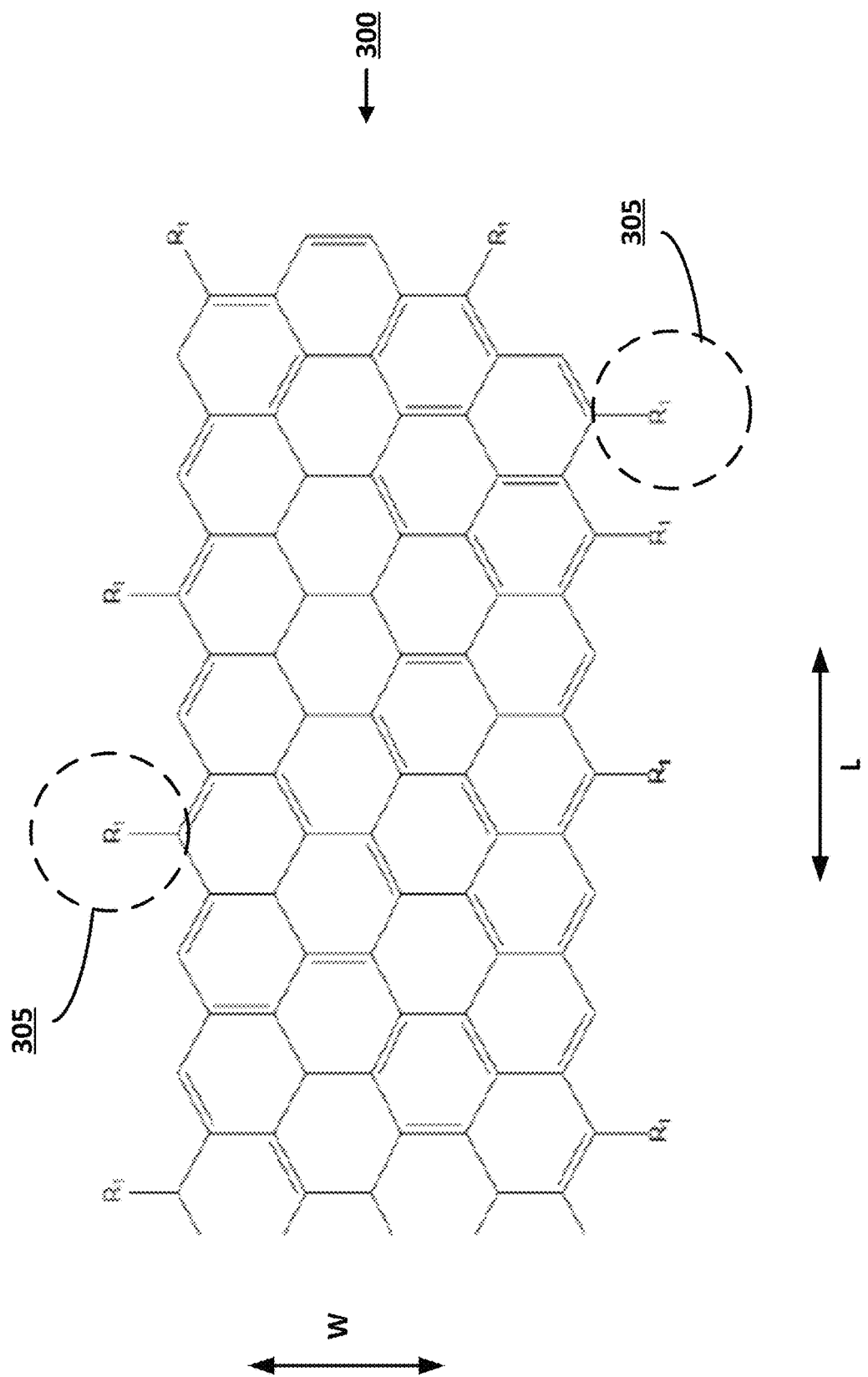
FIG. 3 depicts an example view of a carbon allotrope with edge functional groups, in accordance with various embodiments.

It will be understood that although FIG. 3 illustrates the synthesis of polythiophene nanofibers grown directly from GNR, similar polymerization may occur between other conductive polymers and other conducting carbon allotropes. Such other carbon allotropes may include graphene, carbon fibers, CNTs, GNPs, or some other conductive carbon allotrope. Other conductive polymers may include polyaniline, poly(3,4-ethylenedioxythiophene) (PEDOT), PEDOT/poly(styrene sulphonate) (PSS), polyacetylene, polypyrrole, or some other intrinsically-conductive polymer or copolymer. In other words, even though thiophene and GNRs are used in the specific example herein, other embodiments may include a different carbon allotrope, a different polymer, a different conductive polymer, etc.

The approach described with respect to FIGS. 3-8 may provide a number of benefits. For example, by bonding only to the edges of the C-C $sp^2$ (i.e., double-bonded carbon) hybridization of the GNR may remain intact, thus allowing for efficient electron transport through the GNR. Additionally, by polymerizing PT directly from GNR edges, it may be possible to build a three-dimensional (3D) donor-acceptor network of repeating GNR-PT-GNR units. Finally, conductive polymers may help improve the integration of carbon allotropes into a non-conductive polymer matrix. The non-conductive polymer matrix may include, for example, epoxy, acrylonitrile-butadiene-styrene copolymer, polyimide, or other co-polymers. The now-completed composite may then be embedded into a package substrate such as package substrate 110 through stencil printing, spray deposition, ink-jet printing, or some other deposition technique.

Generally, FIG. 3 depicts an example view of a carbon allotrope with a functional group, in accordance with various embodiments. Specifically, FIG. 3 depicts a GNR 300. The GNR 300 may have a width W and a length L. It will be understood that the specific names of the dimensions of the GNR 300 (e.g., "width" and "length") are used for the sake of discussion only, and are not intended to be determinative with respect to a specific orientation.

As can be seen, the GNR 300 may have a relatively small width W with a thickness of only a few atoms. However, the GNR 300 may have a relatively long length L. The GNR 300 depicted may further extend leftward as oriented in FIG. 3. However, as can be seen, the GNR 300 may have edges (i.e., not further extend) along the top, bottom, and right side of the Figure (as oriented in FIG. 3). The edges of the GNR 300 may include a number of functional groups 305, which are demarcated in FIG. 3 as $R_1$. The functional groups 305 may include, for example, cyanide (—CN), hydroxide (—OH), chlorine (—Cl), bromine (—Br), a carboxylic acid (—COOH), an amide anion such as azanide (—NH$_2$), aldehyde (—CHO), epoxy group (—COC—), or some other similar functional group. In some embodiments, the functional groups 305 may be the same compound, element, or molecule around the periphery of the GNR 300. In other embodiments one functional group 305 may be a different compound, element, or molecule from another functional group 305.

Figure 4:
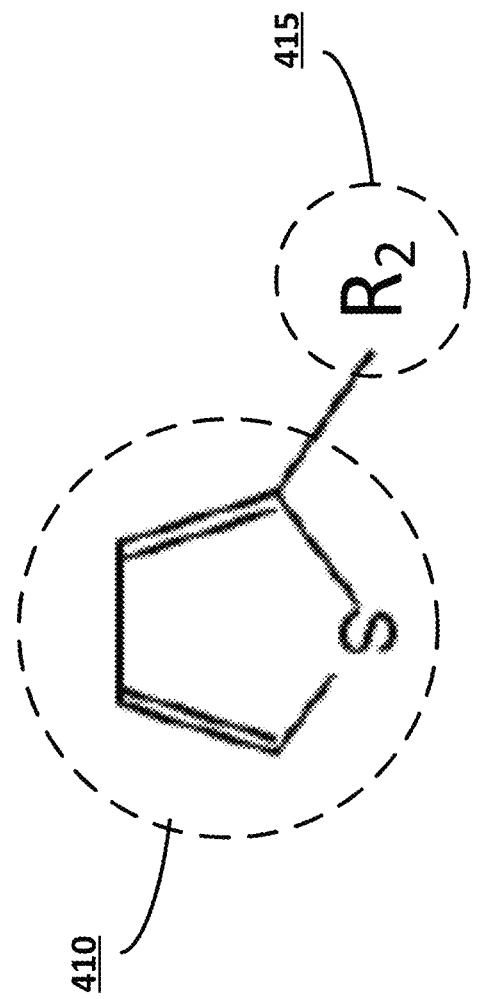
FIG. 4 depicts an example of a molecule coupled with a functional group, in accordance with various embodiments.

FIG. 4 depicts an example of a molecule coupled with a functional group, in accordance with various embodiments. Specifically, FIG. 4 depicts thiophene 410 coupled with a functional group 415 $R_2$. The functional group 415 may be one of the functional groups 305 described above with respect to FIG. 3. Specifically, the functional group 415 may be or include —CN, —OH, —Cl, —Br, —COOH, —NH$_2$, —CHO, —COC— or some other similar but complementary functional group.

Figure 5:
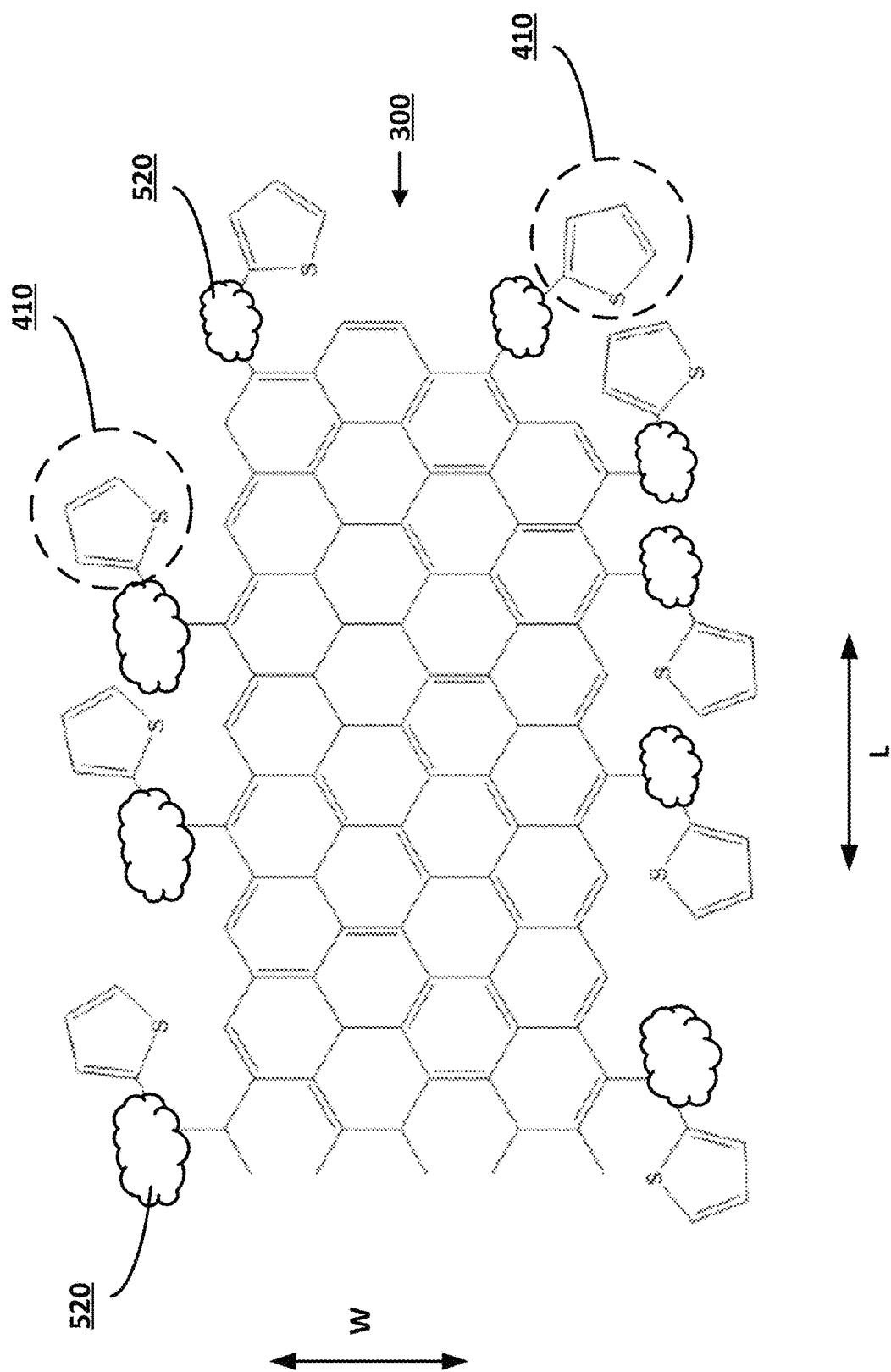
FIG. 5 depicts an example of the carbon allotrope of FIG. 3 functionalized with the molecule of FIG. 4, in accordance with various embodiments.

FIG. 5 depicts an example of the carbon allotrope of FIG. 3 functionalized with the molecule of FIG. 4, in accordance with various embodiments. As used herein, "functionalization" may refer to chemical bonding of an active functional group on one element (e.g., the GNR 300) with another functional group on another element (e.g. the thiophene molecule 410). Specifically, the functional groups 305 and 415 may chemically react with one another to chemically bond the thiophene 410 with the GNR 300. An example of such a reaction may be, for example, an acid-base reaction, click chemistry reactions, or Suzuki coupling reaction. Specifically, one of the functional groups 305 and 415 may be an acid, while the other of the functional groups 305 and 415 may be a base. When the acid and the base are placed in the presence of one another, a chemical reaction may occur wherein the functional groups 305 and 415 may chemically bond with one another (and, in some embodiments, emit a byproduct which is not pictured herein for the sake of clarity and lack of clutter).

In some embodiments, a linker group 520 may result from the functionalization of the GNR 300 and the thiophene 410. The linker group 520 is depicted ambiguously as a "cloud" type shape because the specific molecule may depend on the different chemical reactions that stem from various combinations of functional groups 305 and 415, and the specific synthetic process used during functionalization. As one example of a linker group 520 the thiophene molecule can be covalently bonded to GNR through an ester group, which may be the linker group 520. In other embodiments, the linker group 520 may be a ketone, an amide, or some other molecule or material. In some embodiments, however, the linker group 520 may be some other sort of element, compound, or molecule. In some embodiments, the linker group 520 may not be present, and the thiophene molecule 410 may be directly bonded (e.g., through a carbon-to-carbon bond) with the GNR 300 at the functionalization sites. In some embodiments, certain of the functionalization sites may include a linker group 520 while others of the functionalization sites may not include the linker group, or may include a different type of linker group. In some embodiments, the direct chemical functionalization between thiophene 410 and GNRs 300 may include a single type of a linker group, or multiple linker groups.

Figure 6:
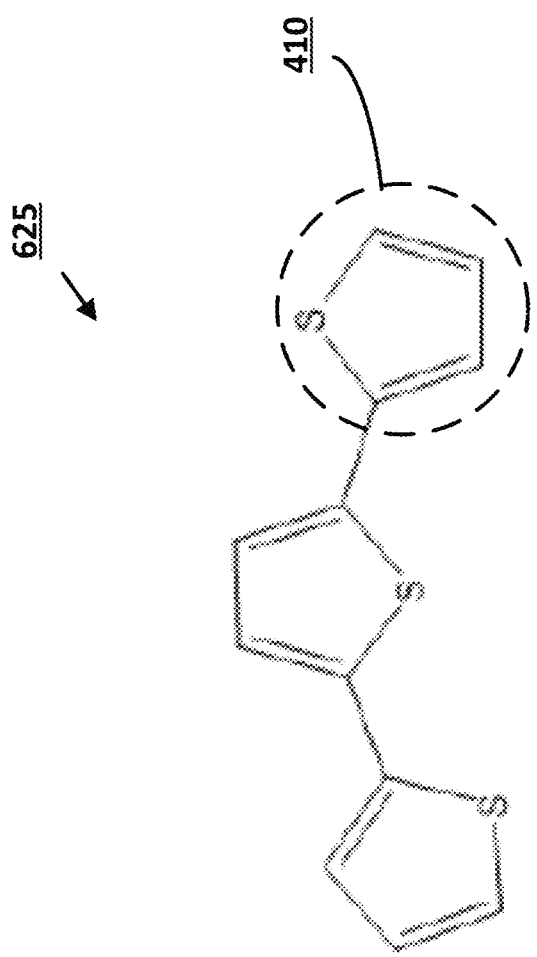
FIG. 6 depicts an example of an electrically-conductive oligomer that includes the molecule of FIG. 4, in accordance with various embodiments.
Figure 7:
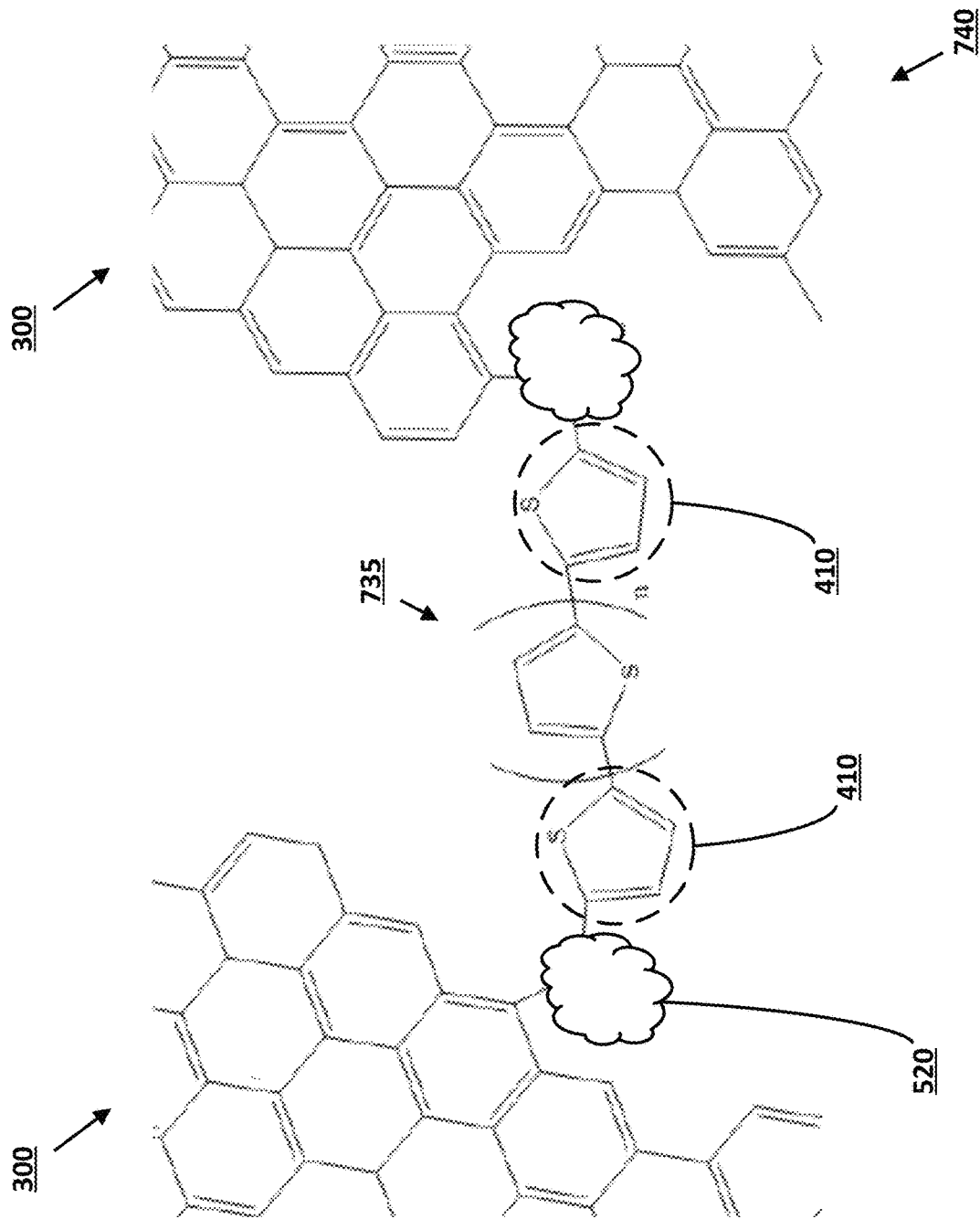
FIG. 7 depicts an example of a portion of an ESD protection material, in accordance with various embodiments.

FIG. 6 depicts a terthiophene molecule 625, which is an oligomer molecule composed of three thiophene monomer units 410, in accordance with various embodiments. FIG. 7 depicts an example of a portion of an ESD protection material 740, in accordance with various embodiments. The ESD protection material 740 may be the material used as, for example, ESD protection material 145. The ESD protection material 740 may include a number of GNRs 300 with functionalized thiophene 410 through linker groups 520. In some embodiments, the ESD protection material 740 may be referred to as "functionalized GNR." In particular a polymeric reaction may occur, for example, via the now covalently bonded thiophene 410 groups on GNR 300 and the addition of a terthiophene in the presence of an oxidant (e.g., FeCl3) to generate a polymer such as PT 735. This synthetic process may lead to GNR-PT-GNR macromolecules, where PT is covalently bonded to two different GNR molecules as illustrated in FIG. 7. The now covalently bonded structure may participate in efficient charge transport through the strong electronic interaction and bandgap matching of PT and GNR repeating units. As can be seen, the PT 735 is indicated by a bracketed thiophene molecule with the notation "n" next to the rightmost bracket. This may indicate that the PT 735 may include a number "n" of linked thiophene molecules. In some embodiments, "n" may be on the order of few oligomeric units (where n<100) or polymeric units of n>100 units depending on the polymeric synthesis.

As noted above, PT 735 may be an electrically-conductive polymer, such as unbranched polythiophene as illustrated in FIG. 7, but other polymers like poly(3-hexylthiophene-2,5-diyl), poly(3,4-ethylenedioxythiophene) (PEDOT), PEDOT/poly(styrene sulphonate) (PSS), can be either grafted-to or grafted-from edge functionalized thiophene-GNR molecules. Therefore, by bonding the GNRs 300 to one another by PT 735, charge transfer may be possible between the GNRs 300 through the PT 735 polymer backbone in an acceptor-donor relationship. In some embodiments, the charge transfer may only occur in the presence of a $V_{in}$ that is at or above $V_{trigger}$. This may be because the band gap for a composite material containing GNRs 300, PT 735 (as shown in FIG. 7) and a non-conducting polymer matrix (not shown) is too large for electrons to participate in electron transport. However, in the presence of a $V_{in}$ that is at or above $V_{trigger}$, the voltage would be able to surpass the composites' intrinsic band gap and induce an electron transport, thus pass electrical current pass from Vin to ground as shown in FIG. 2. In this way, at a voltage $V_{in}$ that is below (or, in some embodiments, at) $V_{trigger}$, may not overcome the electron bandgap and the ESD protection material 740 remains insulative (i.e., not allow for electrical current to flow through the ESD protection material 740 as shown in FIG. 1). However, when the voltage $V_{in}$ is above (or, in some embodiments, at) $V_{trigger}$, the electrons move from the valance band to the conduction band, thus overcoming the electron bandgap to allow current to flow through the ESD protection material 740 as shown in FIG. 2.

Figure 8:
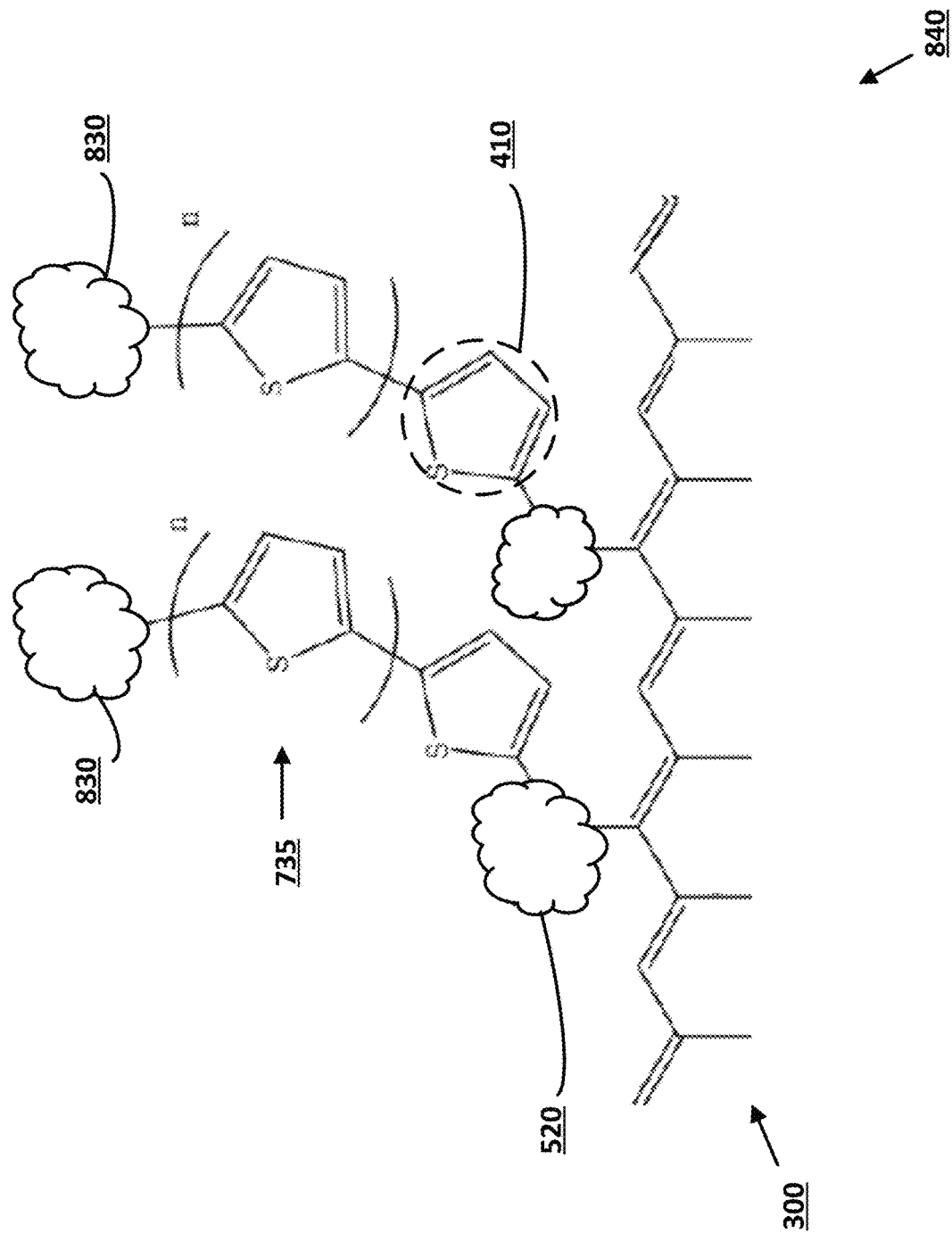
FIG. 8 depicts an alternative view of a portion of an ESD protection material, in accordance with various embodiments.

As noted, conductive polymers such as PT may help improve the integration of carbon allotropes such as the GNRs into a non-conductive polymer matrix such as epoxy or one of the other non-conductive polymer matrices described above. FIG. 8 depicts an alternative view of a portion of the ESD protection material 740, in accordance with various embodiments. As can be seen, the ESD protection material 740 may include a GNR 300 that is coupled with a thiophene molecule 410 by a linker group 520 (although, in some embodiments, the linker group 520 may not be present). The thiophene 410 may be coupled with PT 735 as described above.

The PT 735 may further be coupled with the non-conductive polymer matrix 830. In some embodiments, the PT 735 may be chemically coupled (e.g., functionalized) with the non-conductive polymer matrix 830. This may occur if, for example, the non-conductive polymer matrix 830 includes one or more functional groups such as functional groups 305 or 415. In other embodiments, the PT 735 may be coupled with the non-conductive polymer matrix 830 through physisorption, i.e. van-der waal forces.

It will be understood that although only two GNRs 300 are depicted as coupled with one another in FIG. 7, the ESD protection material 740 may include a repeating GNR-PT-GNR chain (740) and further incorporated into a non-conductive polymer matrix to form an ESD protection material, which may be deposited in a substrate such as substrate 110 through a deposition technique such as those described above to form the ESD protection material 145 described with respect to FIGS. 1 and 2. As described in FIG. 8, the ESD protection material 145 may more specifically include the repeating GNR-PT-GNR chain with the non-conductive polymer matrix 830 described above. In some embodiments, the ESD protection material 740 may include one carbon allotrope such as GNR coupled with another carbon allotrope such as carbon fiber by PT or some other electrically-conductive polymer. As a more complicated example, the ESD protection material 145 could include a chain such as GNR-PT-carbon fiber-PEDOT-GNR, or some other chain. In some embodiments, two GNRs may be coupled together by a copolymer. In some embodiments the electrically-conductive polymer that couples two GNRs together may be different than the electrically-conductive polymer that couples a GNR to the non-conductive polymer matrix 830.

As noted above, the elements of FIGS. 3-8 are discussed herein as a specific example of one embodiment, however other embodiments may additionally or alternatively include different carbon allotropes, a different non-conductive polymer matrix, a different conductive polymer, different functional groups, etc. Additionally, the specific formation of the depicted elements such as the GNR, the specific number of atoms, the specific placement of the functional groups, etc. may be different in other embodiments. Additionally, it will be understood that the edge-based coupling of the GNR to the non-conductive polymer matrix may not occur in some embodiments. Additionally, it will be understood that PT 735 is shown in FIG. 7 as coupling two GNRs, and PT 735 is shown in FIG. 8 as coupling a GNR to the non-conductive polymer matrix 830, in some embodiments the conductive polymer that couples two GNRs may be different than the conductive polymer that couples a GNR to the non-conductive polymer matrix. In some embodiments an alternative non-conductive material such as a non-conductive ceramic may be used in place of, or in addition to, the non-conductive polymer matrix. Other variations may be present.

Figure 9:
FIG. 9 depicts an example technique by which a microelectronic package with an ESD protection material may be formed, in accordance with various embodiments.

FIG. 9 depicts a high level example technique by which a microelectronic package such as microelectronic package 100 may be formed. The technique may be described with respect to embodiments herein, and specifically to embodiments that use GNR and PT, however it will be understood that the technique may be used, in whole or in part, with or without modification, to manufacture a microelectronic package in accordance with other embodiments of the present disclosure.

The technique may include identifying, at 905, in a substrate of a microelectronic package, a ground path that electrically couples a signal path and a ground connection. The substrate may be similar to, for example, substrate 110. The ground path may be similar to, for example, ground path 140. The signal path may be similar to, for example, signal path 135. The ground connection may be similar to, for example interconnect 125.

The technique may further include positioning, at 910, in the ground path between the signal path and the ground connection, an ESD protection material. The ESD protection material may be similar to, for example, ESD protection material 145 or 740.

The ESD protection material may include two electrically-conductive carbon allotropes such as the GNRs 300 of FIG. 7. The electrically-conductive carbon allotropes may be electrically coupled with one another by a first electrically-conductive polymer that is chemically functionalized with the electrically-conductive carbon allotropes. The first electrically-conductive polymer may be, for example, the PT 735 of FIG. 7.

The ESD protection material may further include a non-conductive polymer matrix that is chemically functionalized with the electrically-conductive carbon allotropes by a second electrically-conductive polymer. The non-conductive polymer matrix may be similar to, for example, the non-conductive polymer matrix 830 described above. The second electrically-conductive polymer may be similar to, for example, the PT 735 of FIG. 8. However, in other embodiments, the electrically-conductive polymer that couples two GNRs may be different than the electrically-conductive polymer that couples a GNR to the non-conductive polymer matrix.

Figure 10:
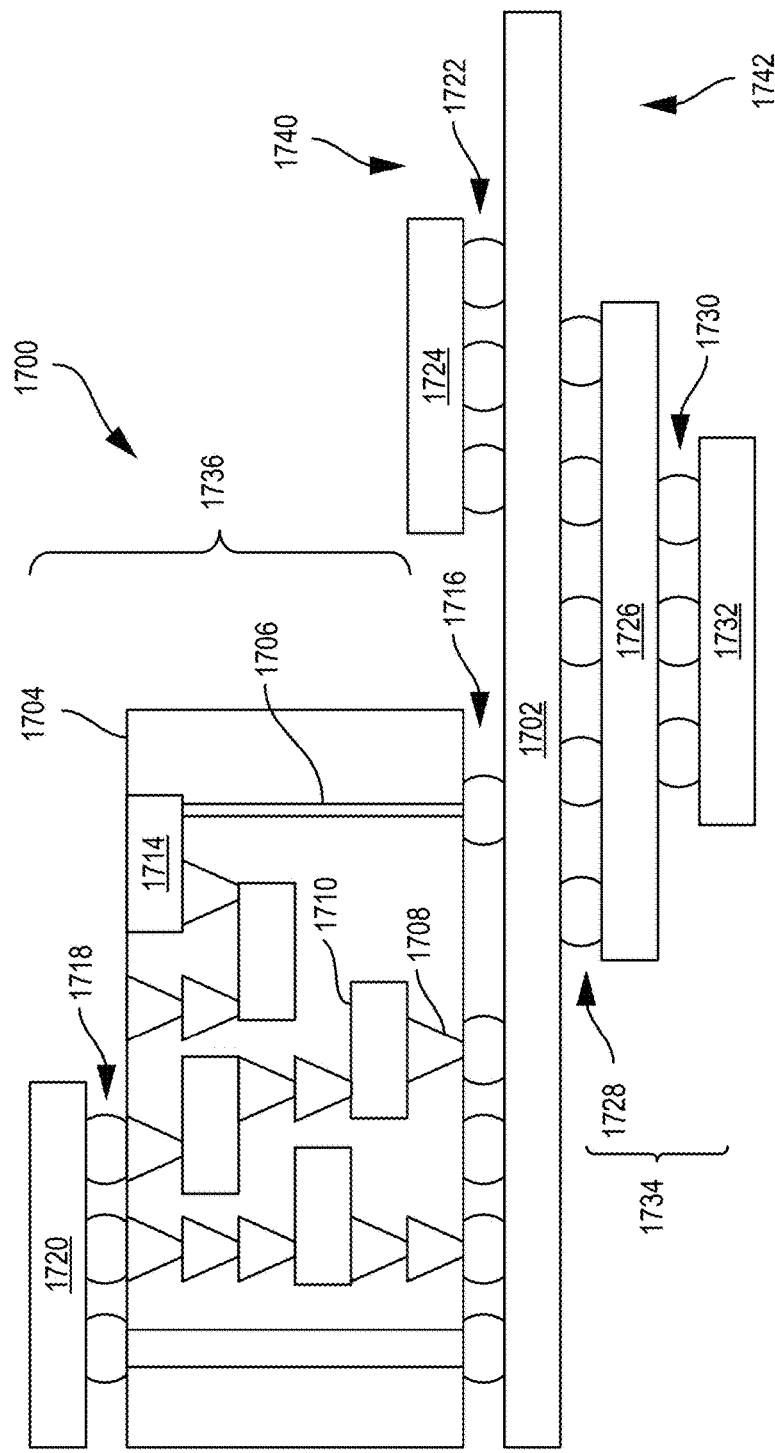
FIG. 10 is a side, cross-sectional view of an IC device assembly that may include an ESD protection material, in accordance with various embodiments.

FIG. 10 is a side, cross-sectional view of an IC device assembly 1700 that may include one or more IC packages or other electronic components (e.g., a die) including one or more microelectronic packages with an ESD protection material, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a PCB including multiple metal layers separated from one another by layers of dielectric material and interconnected by electrically-conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 10 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 10), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 10, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die such as die 105, an IC device, or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 10, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically-conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, ESD devices, and memory devices. More complex devices such as RF devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art. In some embodiments, the package interposer 1704 may include an ESD protection material such as is described herein.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 10 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 11:
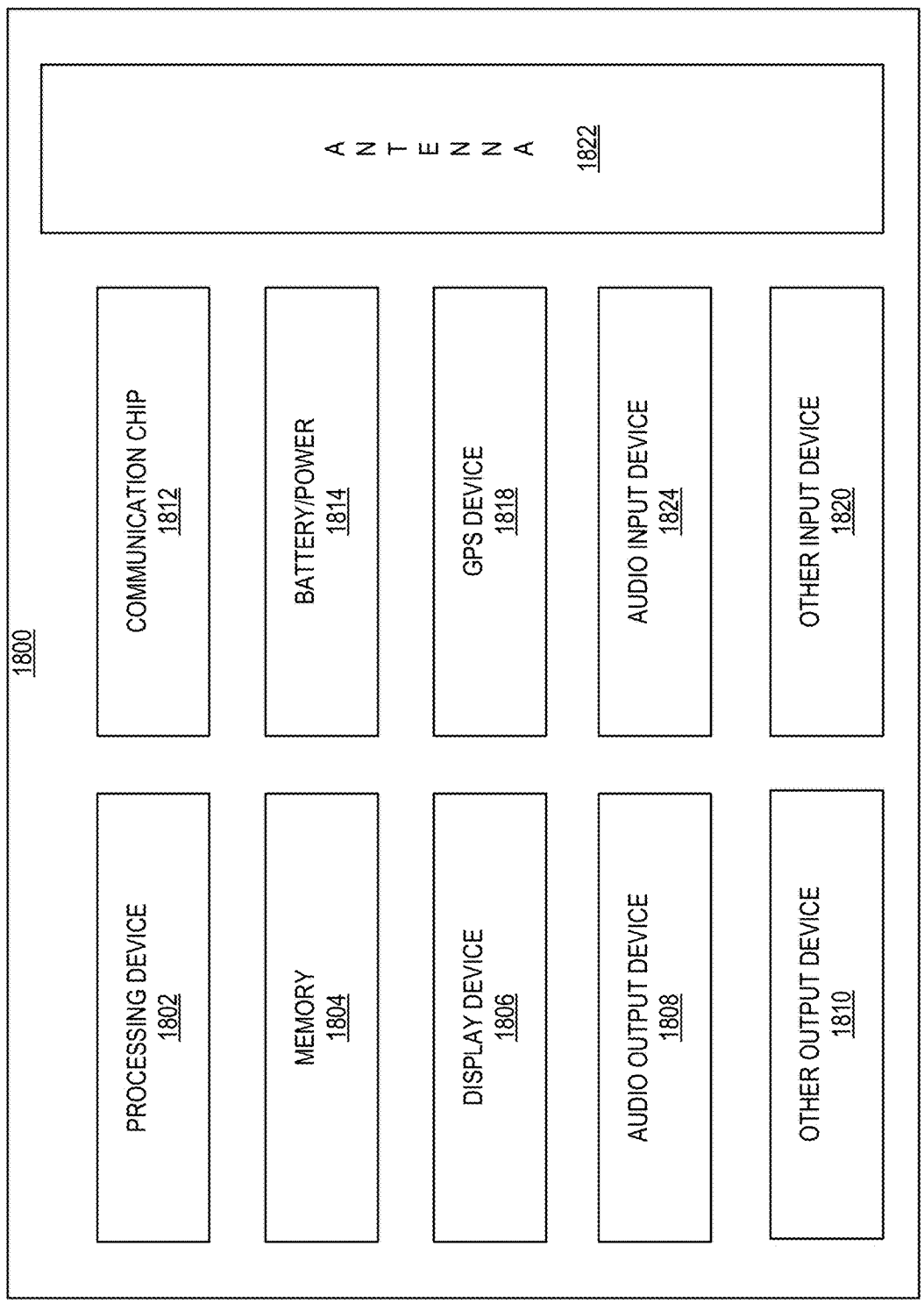
FIG. 11 is a block diagram of an example electrical device that may include an ESD protection material, in accordance with various embodiments.

FIG. 11 is a block diagram of an example electrical device 1800 that may include a microelectronic package with an ESD protection material, in accordance with any of the embodiments disclosed herein. For example, any suitable ones of the components of the electrical device 1800 may include one or more of the IC device assemblies 1700, disclosed herein. A number of components are illustrated in FIG. 11 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 11, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), CPUs, graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random-access memory (DRAM)), nonvolatile memory (e.g., ROM), flash memory, solid state memory, and/or a hard drive. In some embodiments, the memory 1804 may include memory that shares a die with the processing device 1802. This memory may be used as cache memory and may include embedded dynamic random-access memory (eDRAM) or spin transfer torque magnetic random-access memory (STT-M RAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include another output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include another input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

Examples of Various Embodiments

Example 1 includes a material to provide ESD protection in an electrical device, wherein the material comprises: a first electrically-conductive carbon allotrope; a second electrically-conductive carbon allotrope; and an electrically-conductive polymer that is chemically bonded to the first and second electrically-conductive carbon allotropes such that an electrical signal may pass between the first and second electrically-conductive carbon allotropes.

Example 2 includes the material of example 1, wherein the first electrically-conductive carbon allotrope is a carbon nanoribbon.

Example 3 includes the material of example 1, wherein the electrically-conductive polymer is polythiophene.

Example 4 includes the material of example 1, wherein the first electrically-conductive carbon allotrope is graphene.

Example 5 includes the material of example 1, wherein the electrically-conductive polymer is polyacetylene or polyaniline.

Example 6 includes the material of any of examples 1-5, wherein the material further includes a non-conductive polymer matrix.

Example 7 includes the material of example 6, wherein the non-conductive polymer matrix includes epoxy, acrylonitrile-butadiene-styrene copolymer, or polyimide.

Example 8 includes the material of example 6, wherein the non-conductive polymer matrix is bonded to the first electrically-conductive carbon allotrope by a second electrically-conductive polymer.

Example 9 includes the material of any of examples 1-5, wherein the material is non-conductive when a voltage below a threshold voltage is applied to the material, and the material is conductive when a voltage at or above the threshold voltage is applied to the material.

Example 10 includes the material of example 9, wherein the threshold voltage is based on a material used for the first electrically-conductive carbon allotrope, a material used for the second electrically-conductive carbon allotrope, and a material used for the electrically-conductive polymer.

Example 11 includes a microelectronic package for use in an electronic device, wherein the microelectronic package comprises: a signal path electrically positioned between, and coupled to, a die and a voltage input; a ground signal path electrically positioned between, and coupled to, a connection to ground and the signal path; and an ESD protection material coupled to the ground signal path, wherein the ESD protection material includes a first electrically-conductive carbon allotrope, a second electrically-conductive carbon allotrope, and an electrically-conductive polymer that chemically bonds the first and second electrically-conductive carbon allotropes to one another within a non-conductive material.

Example 12 includes the microelectronic package of example 11, wherein the ESD protection material is electrically positioned between the signal path and the connection to ground.

Example 13 includes the microelectronic package of example 11, wherein the voltage input is to provide an input voltage, and wherein the ESD protection material is electrically-conductive when the input voltage is at or above a voltage threshold.

Example 14 includes the microelectronic package of example 11, wherein the voltage input is to provide an input voltage, and wherein the ESD protection material is electrically non-conductive when the input voltage is below a voltage threshold.

Example 15 includes the microelectronic package of any of examples 11-14, wherein the first and second electrically-conductive carbon allotropes are carbon nanotubes.

Example 16 includes the microelectronic package of any of examples 11-14, wherein the electrically-conductive polymer is poly(3,4-ethylenedioxythiophene) (PEDOT), or PEDOT/poly(styrene sulphonate) (PSS).

Example 17 includes a method of forming a microelectronic package for use in an electronic device, wherein the method comprises: identifying, in a substrate of the microelectronic package, a ground path that electrically couples a signal path and a ground connection; and positioning, in the ground path between the signal path and the ground connection, an ESD protection material that includes: two electrically-conductive carbon allotropes that are electrically coupled with one another by a first electrically-conductive polymer that is chemically functionalized with the electrically-conductive carbon allotropes; and a non-conductive polymer matrix that is chemically functionalized with the electrically-conductive carbon allotropes by a second electrically-conductive polymer.

Example 18 includes the method of example 17, wherein positioning the ESD protection material in the ground path includes stencil printing, spray depositing, or ink-jet printing the ESD protection material to the substrate.

Example 19 includes the method of examples 17 or 18, wherein the electrically-conductive carbon allotropes are carbon fibers.

Example 20 includes the method of examples 17 or 18, wherein the first electrically-conductive polymer is polypyrrole.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A microelectronic package comprising:
a die; and
a package substrate coupled to the die with a first interconnect on a first face, wherein the package substrate comprises:
 a second interconnect and a third interconnect on a second face opposite to the first face;
 a conductive signal path between the first interconnect and the second interconnect;
 a conductive ground path between the second interconnect and the third interconnect; and
 an electrostatic discharge (ESD) protection material coupled to the conductive ground path, the ESD protection material comprising a first electrically-conductive carbon allotrope having a first functional group, a second electrically-conductive carbon allotrope having a second functional group, and an electrically-conductive polymer that is chemically bonded to the first functional group and the second functional group permitting an electrical signal to pass between the first and second electrically-conductive carbon allotropes.

2. The microelectronic package of claim 1, wherein the ESD protection material further includes a non-conductive polymer matrix.

3. The microelectronic package of claim 2, wherein the non-conductive polymer matrix is bonded to the first electrically-conductive carbon allotrope by a second electrically-conductive polymer.

4. The microelectronic package of claim 1, wherein the ESD protection material is non-conductive when a voltage below a threshold voltage is applied to the ESD protection material, and the ESD protection material is conductive when a voltage at or above the threshold voltage is applied to the ESD protection material.

5. The microelectronic package of claim 4, wherein the threshold voltage is above a first voltage level at which a data signal or power signal traverses between the IC die and the substrate, and below a second voltage level present in an ESD event.

6. The microelectronic package of claim 4, wherein the threshold voltage is above a first voltage level at which a data signal or power signal traverses between the IC die and the substrate, and below a second voltage level at which the IC die is damaged.

7. The microelectronic package of claim 1, wherein the first electrically-conductive carbon allotrope and the second electrically-conductive carbon allotrope comprise carbon nanotubes.

8. The microelectronic package of claim 1, wherein the electrically-conductive polymer comprises at least one of poly(3,4-ethylenedioxythiophene) (PEDOT), or PEDOT/poly(styrene sulphonate) (PSS).

9. A package substrate comprising:
   a plurality of conductive elements in a plurality of layers of dielectric material;
   a first interconnect on a first face;
   a second interconnect and a third interconnect on a second face opposite to the first face; and
   an ESD protection material embedded in the dielectric material, wherein:
      the ESD protection material comprises a first electrically-conductive carbon allotrope having a first functional group, a second electrically-conductive carbon allotrope having a second functional group, and an electrically-conductive polymer that is chemically bonded to the first functional group and the second functional group permitting an electrical signal to pass between the first and second electrically-conductive carbon allotropes,
      a first set of the plurality of conductive elements provides a signal path between the first interconnect and the second interconnect,
      a second set of the plurality of conductive elements provides a ground path between the second interconnect and the third interconnect, and
      the ESD protection material is coupled to the second set of the plurality of conductive elements.

10. The package substrate of claim 9, wherein the ESD protection material is in the ground path between the signal path and the third interconnect.

11. The package substrate of claim 9, wherein the first electrically-conductive carbon allotrope comprises a carbon nanoribbon.

12. The package substrate of claim 9, wherein the first electrically-conductive carbon allotrope is graphene.

13. The package substrate of claim 9, wherein the electrically-conductive polymer comprises polythiophene.

14. The package substrate of claim 9, wherein the electrically-conductive polymer comprises polyacetylene or polyaniline.

15. The package substrate of claim 9, wherein the ESD protection material further includes a non-conductive polymer matrix.

16. The package substrate of claim 15, wherein the non-conductive polymer matrix includes epoxy, acrylonitrile-butadiene-styrene copolymer, or polyimide.

17. The package substrate of claim 9, wherein the ESD protection material is non-conductive when a voltage below a threshold voltage is applied to the ESD protection material, and the ESD protection material is conductive when a voltage at or above the threshold voltage is applied to the ESD protection material.

18. The package substrate of claim 17, wherein when a voltage below the threshold voltage is applied to the ESD protection material, an electrical signal traverses the signal path but not the ground path.

19. The package substrate of claim 17, wherein when a voltage at or above the threshold voltage is applied to the ESD protection material, a portion of an electrical signal traverses through the signal path and another portion of the electric signal is shunted to the ground through the ground path.

20. The package substrate of claim 17, wherein the threshold voltage varies with a ratio of conductive elements to non-conductive elements in the ESD protection material, wherein the conductive elements include the first electrically-conductive carbon allotrope, the second electrically-conductive carbon allotrope and the electrically-conductive polymer.

* * * * *